United States Patent
Yim et al.

(10) Patent No.: US 9,450,201 B2
(45) Date of Patent: *Sep. 20, 2016

(54) ORGANIC LIGHT EMITTING DISPLAY APPARATUS

(71) Applicant: SAMSUNG DISPLAY CO., LTD., Yongin-si, Gyeonggi-do (KR)

(72) Inventors: Sang-Hoon Yim, Yongin-si (KR); Seong-Min Kim, Yongin-si (KR); Kwan-Hyun Cho, Yongin-si (KR); Kyung-Ho Kim, Yongin-si (KR); Jun-Ho Choi, Yongin-si (KR); Jin-Koo Chung, Yongin-si (KR); Young-Woo Song, Yongin-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/849,681

(22) Filed: Sep. 10, 2015

(65) Prior Publication Data

US 2015/0380687 A1 Dec. 31, 2015

Related U.S. Application Data

(63) Continuation of application No. 14/108,510, filed on Dec. 17, 2013, now Pat. No. 9,136,440.

(30) Foreign Application Priority Data

Mar. 29, 2013 (KR) ........................ 10-2013-0034688

(51) Int. Cl.
*H01L 51/52* (2006.01)
*H01L 27/32* (2006.01)
(Continued)

(52) U.S. Cl.
CPC ......... *H01L 51/524* (2013.01); *H01L 27/3244* (2013.01); *H01L 27/3246* (2013.01); *H01L 27/3258* (2013.01); *H01L 27/3262* (2013.01); *H01L 33/46* (2013.01); *H01L 33/60* (2013.01);
(Continued)

(58) Field of Classification Search
CPC .. H01L 51/524; H01L 33/60; H01L 27/3244
See application file for complete search history.

(56) References Cited

U.S. PATENT DOCUMENTS 8,610,676 B2* 12/2013 Park .................... G06F 3/03545
345/173
8,854,578 B2 10/2014 Yim et al.
(Continued)

FOREIGN PATENT DOCUMENTS

| KR | 10-2004-0082984 A | 9/2004 |
| KR | 10-2006-0057433 A | 5/2006 |
| KR | 10-2010-0090448 A | 8/2010 |

*Primary Examiner* — Joseph C Nicely
(74) *Attorney, Agent, or Firm* — Lee & Morse, P.C.

(57) ABSTRACT

An organic light emitting display apparatus includes a substrate, an encapsulation member facing the substrate, a plurality of pixels between the substrate and the encapsulation member, each pixel including a light emission area and a non-emission area, a first electrode overlapping at least the light emission area, an intermediate layer on the first electrode and including an organic emission layer, a second electrode on the intermediate layer, and a reflective member on a bottom surface of the encapsulation member, the bottom surface of the encapsulation member facing the substrate, and the reflective member including an opening corresponding to the light emission area, and a reflective surface around the opening and corresponding to the non-emission area.

14 Claims, 7 Drawing Sheets

(51) Int. Cl.
  *H01L 33/46* (2010.01)
  *H01L 33/60* (2010.01)
(52) U.S. Cl.
  CPC ....... *H01L 51/5253* (2013.01); *H01L 51/5271* (2013.01)

(56) References Cited

U.S. PATENT DOCUMENTS

| | | | | |
|---|---|---|---|---|
| 8,917,019 B2* | 12/2014 | Kim | | H01L 27/3276 313/504 |
| 8,933,625 B2* | 1/2015 | Chung | | H01L 51/5271 313/504 |
| 9,136,440 B2* | 9/2015 | Yim | | H01L 27/3244 |
| 2002/0011783 A1* | 1/2002 | Hosokawa | | H01L 27/3244 313/504 |
| 2004/0196420 A1 | 10/2004 | Wu et al. | | |
| 2006/0158110 A1 | 7/2006 | Kim et al. | | |
| 2008/0218091 A1* | 9/2008 | Jo | | H01L 27/3276 315/169.3 |
| 2009/0079336 A1* | 3/2009 | Yamada | | H01L 51/5265 313/504 |
| 2009/0194780 A1* | 8/2009 | Kwon | | H01L 27/3426 257/98 |
| 2009/0236981 A1* | 9/2009 | Chang | | H01L 51/5253 313/504 |
| 2010/0015424 A1* | 1/2010 | Seo | | H01L 51/0013 428/216 |
| 2010/0201609 A1* | 8/2010 | Kim | | H01L 51/5271 345/76 |
| 2011/0013126 A1 | 1/2011 | Wang et al. | | |
| 2011/0127500 A1* | 6/2011 | Ko | | H01L 27/3211 257/40 |
| 2011/0220901 A1* | 9/2011 | Ha | | H01L 27/3258 257/59 |
| 2012/0299472 A1* | 11/2012 | Chung | | H01L 51/5271 313/504 |
| 2014/0291637 A1* | 10/2014 | Yim | | H01L 27/3244 257/40 |
| 2014/0299850 A1* | 10/2014 | Yim | | H01L 33/60 257/40 |

\* cited by examiner

+

ORGANIC LIGHT EMITTING DISPLAY APPARATUS

CROSS-REFERENCE TO RELATED PATENT APPLICATIONS

This is a continuation application based on pending application Ser. No. 14/108,510, filed Dec. 17, 2013, the entire contents of which is hereby incorporated by reference.

This application claims the benefit of Korean Patent Application No. 10-2013-0034688, filed on Mar. 29, 2013, in the Korean Intellectual Property Office, the disclosure of which is incorporated herein in its entirety by reference.

BACKGROUND

1. Field

Example embodiments relate to an organic light emitting display apparatus, and more particularly, to an organic light emitting display apparatus capable of improving user convenience.

2. Description of the Related Art

Recently, display apparatuses have been replaced with thin flat plate display apparatuses that may be portable. Among those flat plate display apparatuses, organic light emitting display apparatuses are self-emission type display apparatuses having wide viewing angle, high contrast, and fast response speed. Thus, the organic light emitting display apparatuses are considered as next generation display apparatuses.

A conventional organic light emitting display apparatus may include an intermediate layer, a first electrode, and a second electrode. The intermediate layer may include an organic emission layer, and when voltages are applied to the first and second electrodes, the organic emission layer emits light, e.g., visible rays.

SUMMARY

Example embodiments provide an organic light emitting display apparatus capable of easily improving user convenience.

According to an aspect of the example embodiments, there is provided an organic light emitting display apparatus including a substrate, an encapsulation member facing the substrate, a plurality of pixels between the substrate and the encapsulation member, each pixel including a light emission area and a non-emission area, a first electrode overlapping at least the light emission area, an intermediate layer on the first electrode and including an organic emission layer, a second electrode on the intermediate layer, and a reflective member on a bottom surface of the encapsulation member, the bottom surface of the encapsulation member facing the substrate, and the reflective member including an opening corresponding to the light emission area, and a reflective surface around the opening and corresponding to the non-emission area.

The organic light emitting display apparatus may further include a transmission area formed on the non-emission area and disposed to overlap the reflective surface.

The transmission area may be formed commonly throughout at least two pixels among the plurality of pixels.

The second electrode may include a transmission window to correspond to the transmission area.

Each of the pixels may include at least one insulating layer, and the at least one insulating layer may include a transmission window to correspond to the transmission area.

Each of the pixels may include at least one insulating layer, the at least one insulating layer may include a transmission window to correspond to the transmission area, the second electrode may include a transmission window to correspond to the transmission area, and the transmission window of the insulating layer and the transmission window of the second electrode may have the same patterns as each other.

The reflective surface of the reflective member may have a specular reflection property.

A reflectivity of the reflective member may be about 90% to 110% of an average reflectivity of the light emission area.

The reflectivity of the reflective surface of the reflective member with respect to light having a wavelength of about 700 nm to 800 nm may be greater than the reflectivity with respect to light having a wavelength of about 400 nm to 500 nm.

The reflective member may include Ni, Cr, W, V, or Mo.

Each of the pixels may include a pixel circuit unit for driving the light emission area, and the pixel circuit unit may be disposed to overlap the light emission area.

Each of the pixels may include a circuit area disposed on the non-emission area and a pixel circuit unit for driving the light emission area, wherein the pixel circuit unit may be disposed on the circuit area.

Each of the pixels may include a pixel circuit unit for driving the light emission area, and the pixel circuit unit may include a thin film transistor that is electrically connected to the first electrode and may include an active layer, a gate electrode, a source electrode, and a drain electrode.

BRIEF DESCRIPTION OF THE DRAWINGS

The above and other features and advantages of the example embodiments will become more apparent by describing in detail embodiments with reference to the attached drawings, in which.

DETAILED DESCRIPTION

Hereinafter, embodiments will be described in detail with reference to accompanying drawings.

Figure 1:
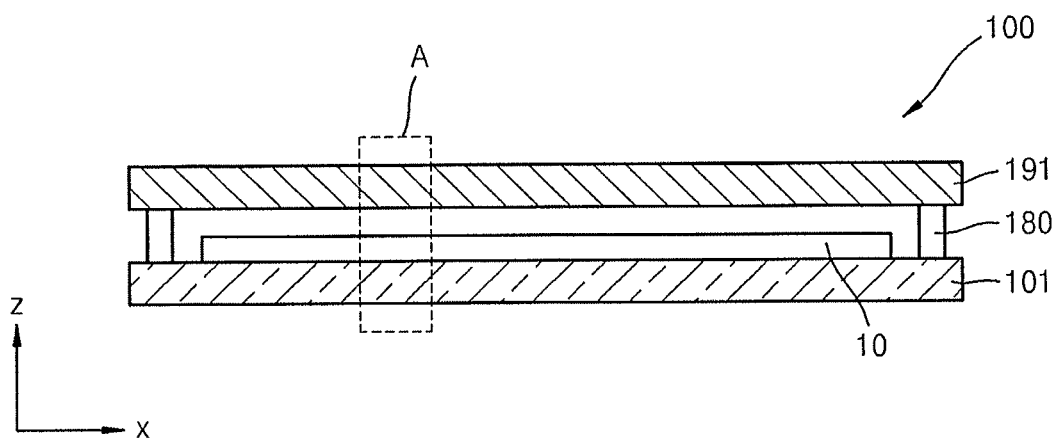
FIG. 1 is a schematic cross-sectional view of an organic light emitting display apparatus according to an embodiment.
Figure 2:
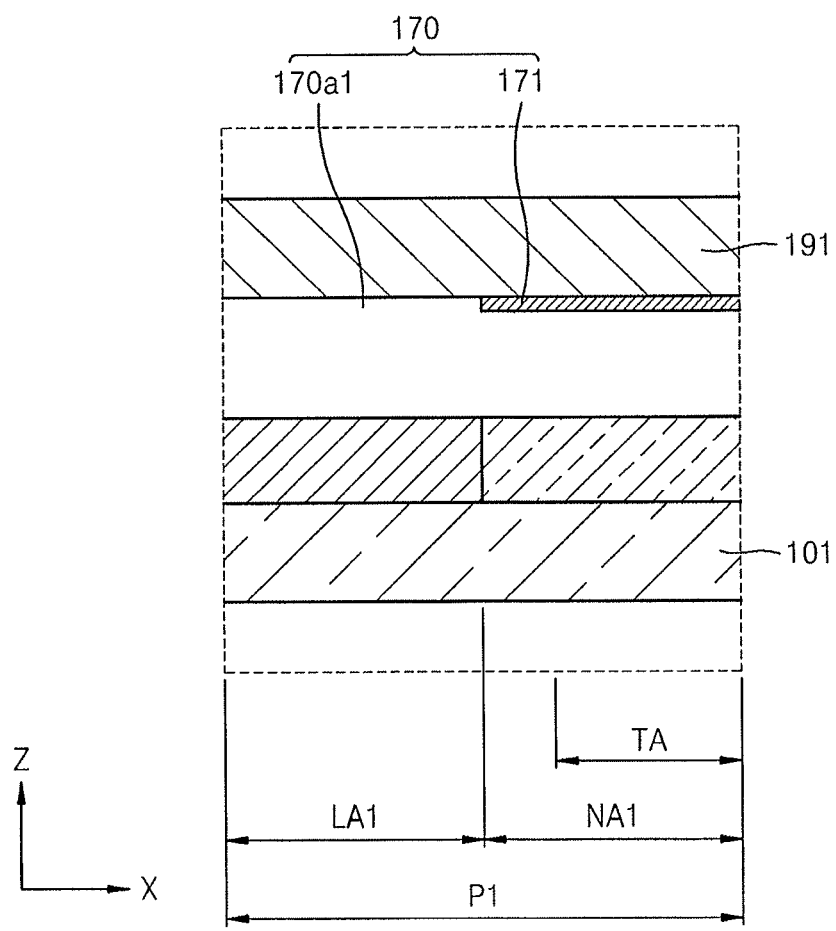
FIG. 2 is an enlarged view of portion A in FIG. 1.
Figure 3:
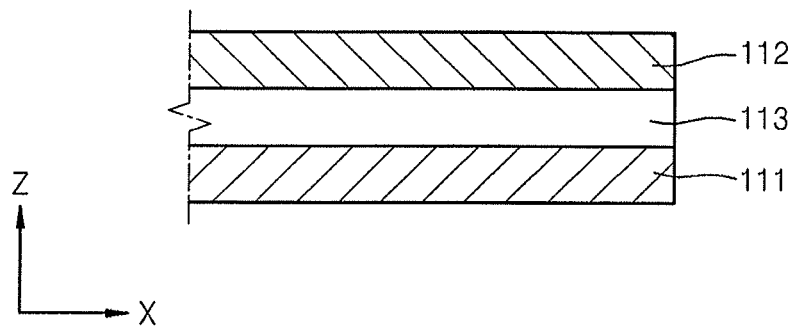
FIG. 3 is a detailed cross-section of a light emission area in FIG. 2.
Figure 4:
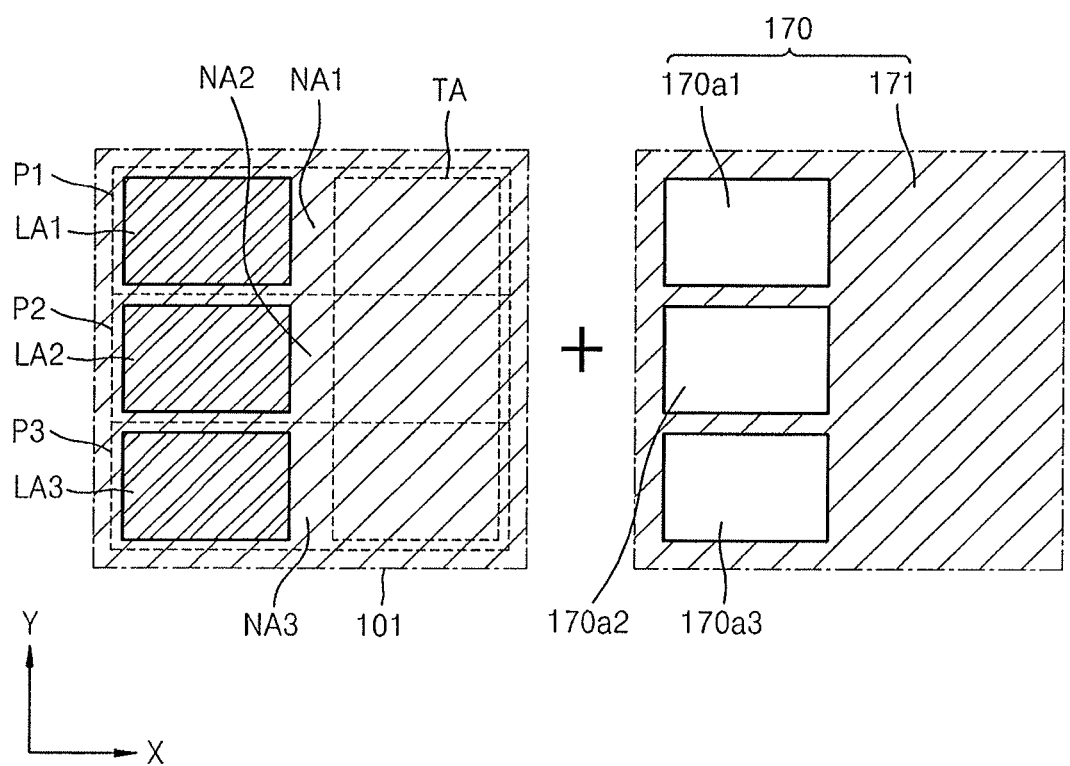
FIG. 4 is a detailed plan view of a reflective member from FIG. 1.

FIG. 1 is a schematic cross-sectional view of an organic light emitting display apparatus 100 according to an embodiment, and FIG. 3 is an enlarged view of portion A shown in FIG. 1. FIG. 3 is a diagram showing a light emission area shown in FIG. 2 in detail, and FIG. 4 is a plan view showing a reflective member of FIG. 1 in detail.

Referring to FIGS. 1 through 4, the organic light emitting display apparatus 100 may include a substrate 101, an encapsulation member 191, and a display unit 10 disposed between the substrate 101 and the encapsulation member 191. The substrate 101 and the encapsulation member 191 may be bonded to each other by a sealing member 180. A moisture absorbent or a filling material may be disposed in a space formed between the substrate 101 and the encapsulation member 191 by the sealing member 180.

The substrate 101 may be formed of a transparent glass material, e.g., containing mainly $SiO_2$. However, example embodiments are not limited thereto, e.g., the substrate 101 may be formed of a transparent plastic material. The encapsulation member 191 may be formed of the same material as that of the substrate 101, e.g., a transparent glass material or a plastic material.

The display unit 10 on the substrate 101 may include a plurality of pixels. Referring to FIG. 2, one pixel P1 is shown. Referring to FIG. 4, three pixels P1, P2, and P3 are shown.

Referring to FIG. 2, the pixel P1 includes a light-emission area LA1 and a non-emission area NA1. The light-emission area LA1 emits visible light, e.g., directly toward a user, to form images recognized by a user. The light-emission area LA1 may be formed in various shapes.

FIG. 3 is a diagram showing an example of the light-emission area LA1. Referring to FIG. 3, the light-emission area LA1 may include a first electrode 111, a second electrode 112, and an intermediate layer 113.

The first electrode 111 may include, e.g., indium tin oxide (ITO), indium zinc oxide (IZO), ZnO, and/or $In_2O_3$. Also, the first electrode 111 may include, e.g., Ag, Mg, Al, Pt, Pd, Au, Ni, Nd, Ir, Cr, Li, Yb, and/or Ca.

A buffer layer (not shown) may be formed before the first electrode 111 is formed on the substrate 101. The buffer layer (not shown) prevents impurity elements from penetrating into the substrate 101 while planarizing an upper surface of the substrate 101, and may be formed of various materials capable of performing the above functions. For example, the buffer layer (not shown) may be formed of an inorganic material, e.g., silicon oxide, silicon nitride, silicon oxynitride, aluminum oxide, aluminum nitride, titanium oxide, and/or titanium nitride, an organic material, e.g., polyimide, polyester, or acryl, or a stacked layer thereof.

The intermediate layer 113 is formed on the first electrode 111. The intermediate layer 113 includes an organic emission layer for emitting visible rays. The intermediate layer 113 may be formed as a low-molecular weight organic layer or a high-molecular weight organic layer. When the intermediate layer 113 is formed as a low-molecular weight organic layer, a single or multi-layer structure including a hole injection layer (HIL), a hole transport layer (HTL), an organic emission layer, an electron transport layer (ETL), and an electron injection layer (EIL) may be formed. The HIL may be formed of a phthalocyanine compound, e.g., copper phthalocyanine, or a starburst type amine compound, e.g., TCTA, m-MTDATA, or m-MTDAPB. The HTL may be formed of, e.g., N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), and the like. The EIL may be formed of, e.g., LiF, NaCl, CsF, $Li_2O$, BaO, or Liq. The ETL may be formed of, e.g., $Alq_3$.

The organic emission layer may include a host material and a dopant material. The host material of the organic emission layer may be, e.g., $Alq_3$, 9,10-di(naphty-2-yl) anthracene (AND), 2-tert-butyl-9,10-bis-(β-naphthyl)-anthracene (TBADN), 4,4'-Bis(2,2-diphenylvinyl)-1,1'-biphenyl (DPVBi), 4,4'-Bis[2,2-di(4-methylphenyl)-ethen-1-yl] biphenyl (p-DMDPVBi), Tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), Bis(9,9-diarylfluorene)s (BDAF), 4,4'-bis(2,2-diphenyl-ethene-1-yl)-4,4'-di-(tert-butyl)phenyl (p-TDPVBi), N,N'-dicarbazolyl-3,5-benzene (mCP), 1,3,5-Tris(carbazol-9-yl)benzene (tCP), 4,4',4''-Tris(carbazol-9-yl)triphenylamine (TcTa), 4,4'-N,N'-dicarbazole-biphenyl (CBP), 4,4'-bis(9-carbazolyl)-2,2'-dimethyl-biphenyl (CBDP), 4,4'-Bis (carbazol-9-yl)-9,9-dimethylfluorene (DMFL-CBP), 4,4'-bis (carbazole-9-yl)-9,9-bis(9-phenyl-9H-carbazole)fluorene (FL-4CBP), 4,4'-bis(carbazol-9-yl)-9,9-ditolylfluorene (DPFL-CBP), or 9,9-bis 9-phenyl-9H-carbazol)fluorene (FL-2CBP). The dopant material of the organic emission layer may be, e.g., 1,4'-bis[4-(di-p-tolylamino)styryl]biphenyl (DPAVBi), 9,10-di-(2-naphthyl)anthracene (ADN), or 2-tert-butyl-9,10-di(naphth-2-yl)anthracene (TBADN).

The second electrode 112 may be formed on the intermediate layer 113. The second electrode 112 may be formed of a metal material, e.g., Ag, Mg, Al, Pt, Pd, Au, Ni, Nd, Ir, Cr, Li, or Ca. If necessary, the second electrode 112 may include, e.g., ITO, IZO, ZnO, or $In_2O_3$.

The non-emission area NA1 is formed around, e.g., around an entire perimeter of the light emission area LA1 to be adjacent to the light emission area LA1. Circuits for driving the light emission area LA1 may be disposed on the non-emission area NA1. Also, as shown in FIGS. 2 and 4, the non-emission area NA1 may include a transmission area TA. The transmission area TA may be configured by forming a transmission window in one or more insulating layers (not shown) formed on the substrate 101. Otherwise, the transmission area TA may be configured by forming a transmission window in one or more conductive layers (not shown) formed on the substrate 101.

As shown in FIG. 4, each of the pixels P1, P2, and P3 includes a light emission area LA1, LA2, or LA3 and a non-emission area NA1, NA2, or NA3. Also, each of the pixels P1, P2, and P3 may include a common transmission area TA formed in the non-emission areas NA1, NA2, and NA3. However, example embodiments are not limited thereto, e.g., each of the pixels P1, P2, and P3 may include a separate transmission area TA separated from each other, like the light emission areas LA1, LA2, and LA3.

A reflective member 170 may be formed on, e.g., directly on, a surface of the encapsulation member 191. In particular, the reflective member 170 is formed on a surface of the encapsulation member 191, wherein the surface of the encapsulation member 191 faces the substrate 101. Referring to FIG. 2, the reflective member 170 includes at least one opening and a reflective surface 171. The reflective surface 171 is disposed around, e.g., peripherally with respect to, the at least one opening, e.g., around an entire perimeter of the opening 170a1. Also, the reflective surface 171 corresponds to, e.g., completely overlaps, the non-emission area NA1, and the opening 170a1 corresponds to, e.g., completely overlaps, the light emission area LA1.

For example, referring to FIG. 4, the opening 170a1 of the reflective member 170 may correspond to the light emission area LA1 of the pixel P1, an opening 170a2 may correspond to the light emission area LA2 of the pixel P2, and an opening 170a3 may correspond to the light emission area LA3 of the pixel P3. The reflective surface 171 of the reflective member 170 may be formed, e.g., continuously as a single layer, around the openings 170a1, 170a2, and 170a3 to correspond to the non-emission areas NA1, NA2, and NA3 of the pixels P1, P2, and P3. That is, the reflective surface 171 overlaps the, e.g., entire, transmission area TA.

The reflective surface 171 exhibits reflectivity. In particular, the reflective surface 171 may exhibit a same or a similar reflectivity as that of each pixel P1, P2, or P3, i.e., reflectivity of the light emission areas LA1, LA2, or LA3. Since reflectivity of the light emission area LA1, LA2, or LA3 is about 60%, the reflectivity of the reflective surface 171 is about 60%.

A difference between the reflectivity of the reflective surface 171 and an average reflectivity of the light emission areas LA1, LA2, and LA3 may be about 10% or less. As such, the organic light emitting display apparatus 100 of the present embodiment may realize an image display function and a mirror function at the same time. For example, the reflectivity of the reflective surface 171 may be set to be similar to or the same as that of the light emission areas LA1, LA2, and LA3 displaying images, e.g., about 90% to about 110% of the average reflectivity of the light emission areas LA1, LA2, and LA3. Therefore, a mirror function of the organic light emitting display apparatus 100 may be realized effectively without affecting the images displayed on the light emission areas LA1, LA2, and LA3.

In detail, the reflection type from the light emission areas LA1, LA2, and LA3 is specular reflection, and the reflection type from the reflective surface 171 is also specular reflection. Thus, in the organic light emitting display apparatus 100, diffuse reflection may be restrained and the specular reflection is increased in order to prevent blurring phenomenon. Thus, the mirror display function of the organic light emitting display apparatus 100 may be realized effectively.

To do this, the reflective surface 171 is formed by using a predetermined metal material, e.g., Ni, Cr, W, V, or Mo. Such predetermined metal material may exhibit reflectivity that is similar to that of the pixels P1, P2, and P3.

In detail, the reflectivity of the pixels P1, P2, and P3 with respect to long wavelengths of light, e.g., about 700 nm to about 800 nm, is higher than the reflectivity of the pixels P1, P2, and P3 with respect to short wavelengths of light, e.g., about 400 nm to about 500 nm. Thus, the reflectivity of the reflective surface 171 with respect to long wavelengths of light is set to be higher than the reflectivity of the reflective surface 171 with respect to the short wavelengths of light. As such, the reflection property of the reflective surface 171 may be similar to that of the light emission area LA.

Also, the reflective surface 171 has a predetermined thickness. In particular, the reflective surface 171 may have a thickness of about 500 μm or greater. If the thickness of the reflective surface 171 is less than 500 μm, light may be partially transmitted through the reflective surface 171, thereby reducing the reflectivity of the reflective surface 171 to a less than a desirable level, which in turn may make it difficult to effectively show the mirror display function of the organic light emitting display apparatus.

The organic light emitting display apparatus 100 of the present embodiment includes the reflective member 170 formed on a lower surface of the encapsulation member 191. The reflective member 170 includes the openings 170a1, 170a2, and 170a3 corresponding to the light emission areas LA1, LA2, and LA3 of the pixels P1, P2, and P3 so as not to affect light emission, i.e., the display of images. Further, the reflective member 170 may include the reflective surface 171 around the openings 170a1, 170a2, and 170a3, i.e., corresponding to the non-emission areas NA1, NA2, and NA3, so that the organic light emission display apparatus 100 may serve as a mirror display. Here, the reflectivity of the reflective surface 171 is set to be similar to that of the light emission areas LA1, LA2, and LA3, e.g., the reflectivity with respect to the light of longer wavelength (700 to 800 nm) is set to be higher than that with respect to the light of shorter wavelength (400 to 500 nm) so that the reflection type of the reflective surface 171 is similar to that of the light emission areas LA1, LA2, and LA3. Thus, the organic light emitting display apparatus 100 may exhibit uniform specular light reflection, e.g., from its entire surface overlapping all pixels, without degrading image quality characteristics.

Also, each of the pixels P1, P2, and P3 selectively includes the transmission area TA in the non-emission area NA1, NA2, and/or NA3, so that the reflective surface 171 corresponds to the transmission area TA. Accordingly, the light reflected by the reflective surface 171 may be transmitted to the user effectively through the transmission area TA. Thus, the mirror display performance of the organic light emitting display apparatus 100 may be improved. Also, even when the light emission area LA of the organic light emitting display apparatus 100 stops operating, the light reflected by the reflective surface 171 may be transmitted to the user easily through the transmission area TA, and accordingly, the organic light emitting display apparatus 100 may serve as a general mirror.

Figure 5:
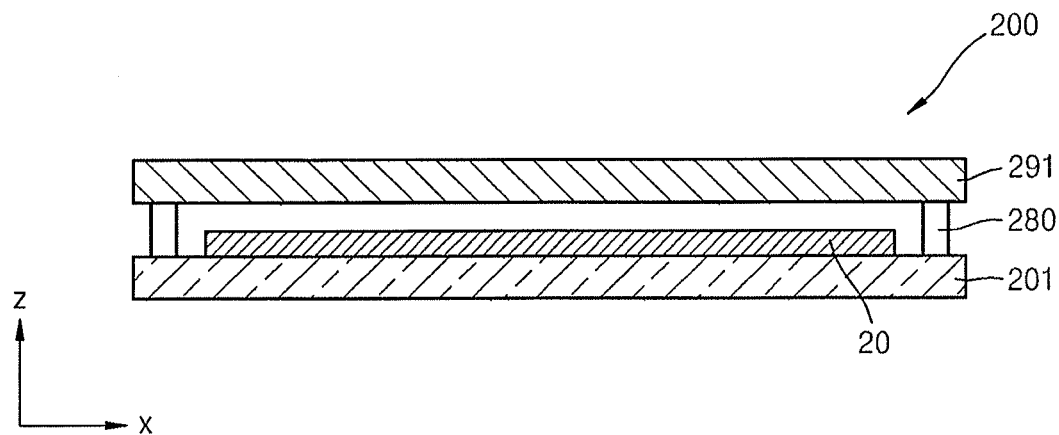
FIG. 5 is a schematic cross-sectional view of an organic light emitting display apparatus according to another embodiment.
Figure 6:
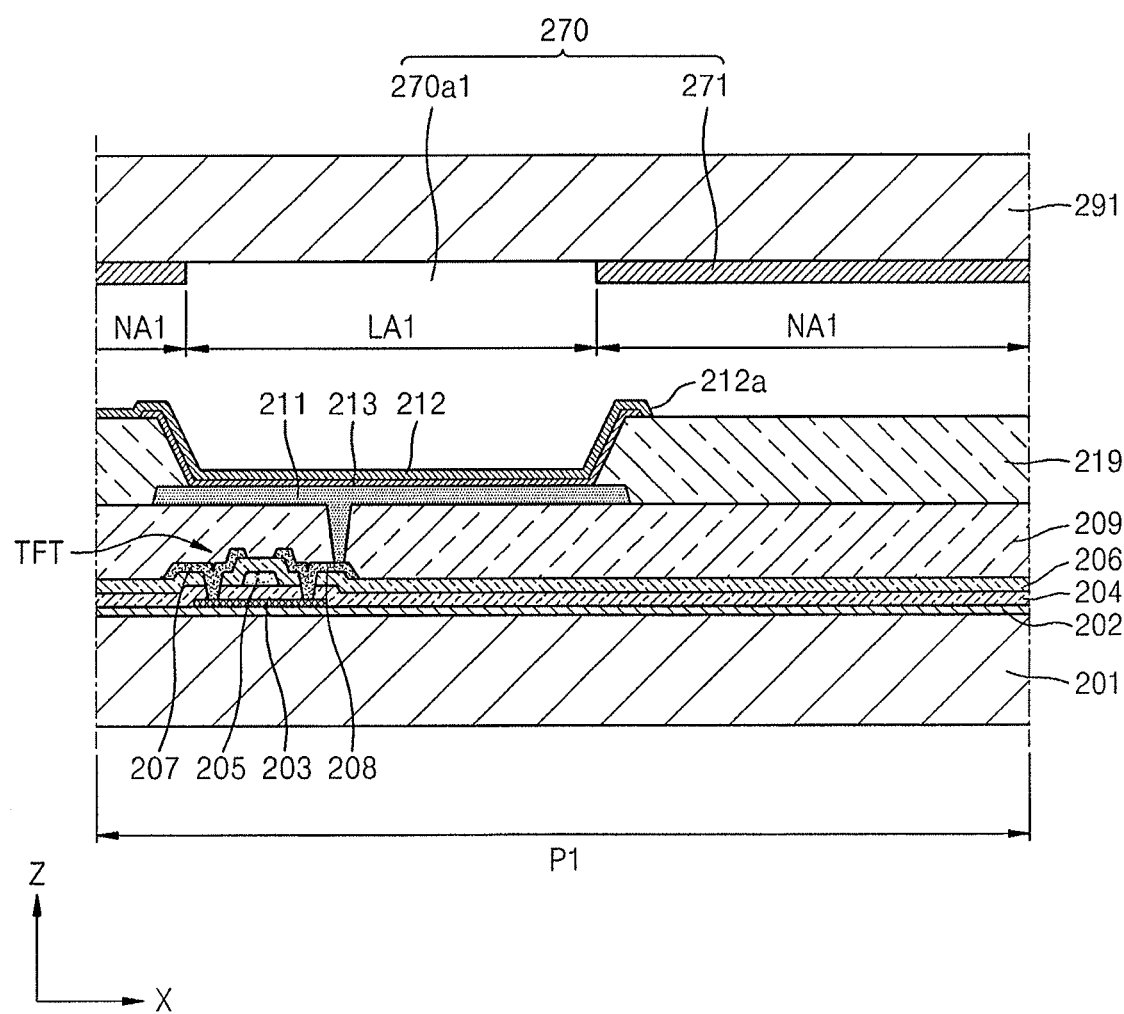
FIG. 6 is a cross-sectional view of a pixel in the organic light emitting display apparatus of FIG. 5.
Figure 7:
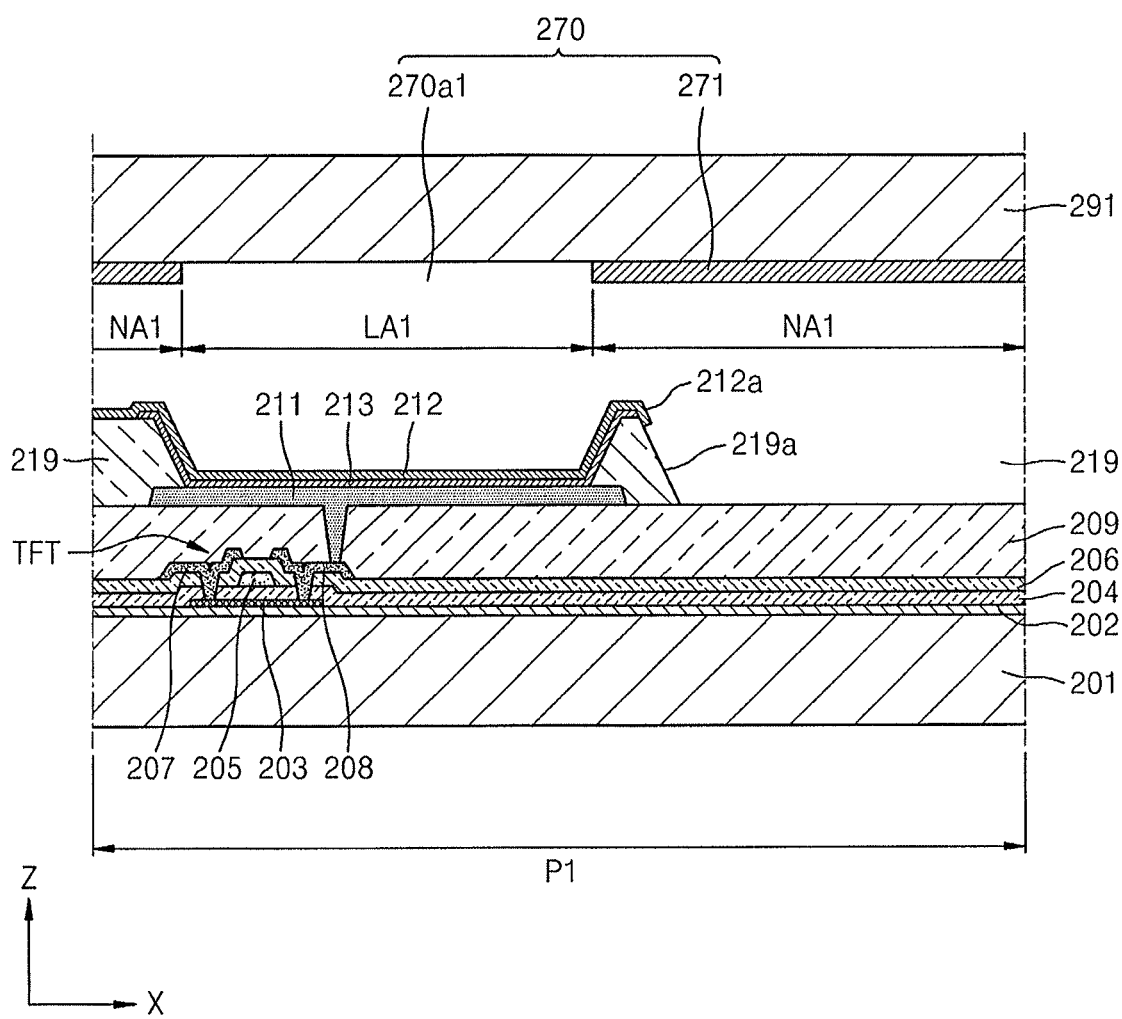
FIG. 7 is a cross-sectional view of a modified example of the pixel in FIG. 6.
Figure 8:
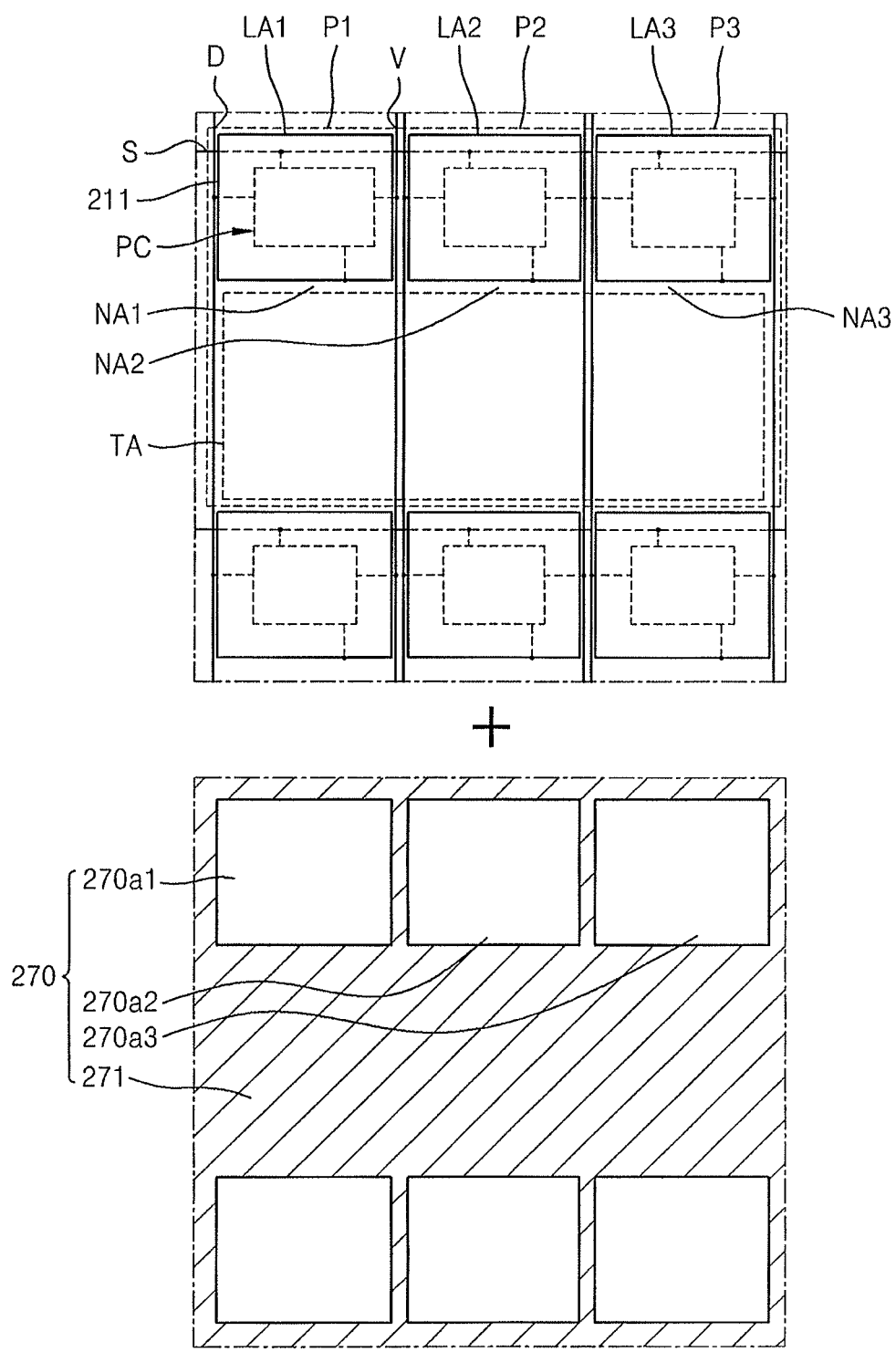
FIG. 8 is a detailed plan view of a reflective member from FIG. 6.

FIG. 5 is a cross-sectional view schematically showing an organic light emitting display apparatus 200 according to another embodiment, and FIG. 6 is a cross-sectional view of a pixel P1 in a display unit of the organic light emitting display apparatus 200 shown in FIG. 5. FIG. 7 shows another modified example of the pixel shown in FIG. 6, and FIG. 8 is a plan view showing a reflective member shown in FIG. 6. For convenience of description, differences relative to the previous embodiment will be described below.

Referring to FIGS. 5 through 8, the organic light emitting display apparatus 200 may include a substrate 201, an encapsulation member 291, and a display unit 20 disposed between the substrate 201 and the encapsulation member 291. The substrate 201 and the encapsulation member 291 may be bonded to each other by a sealing member 280.

The display unit 20 on the substrate 201 may include a plurality of pixels. Referring to FIG. 6, one pixel P1 is shown. Referring to FIG. 8, three pixels P1, P2, and P3 are shown.

Referring to FIG. 6, the pixel P1 includes a light emission area LA1 and a non-emission area NA1. The light emission area LA1 emits visible light directly to realize images recognized by the user. In the light emission area LA1, a first electrode 211, a second electrode 212, and an intermediate layer 213 are formed, e.g., an organic light emitting diode.

Also, as shown in FIG. 8, a pixel circuit unit PC may be disposed in the light emission area LA1. Referring to FIG. 8, a data line D, a scan line S, and a power line V may be connected to the pixel circuit unit PC. Also, the pixel circuit unit PC may include at least one thin film transistor TFT as shown in FIG. 6. In particular, the TFT is a driving transistor, and although not shown in FIG. 8, the pixel circuit unit PC may further include a switching transistor and a capacitor.

Referring to FIG. 6, a buffer layer 202 may be formed on the substrate 201. As described above, since the buffer layer 202 is an optional element, it may be omitted.

The TFT is formed on the buffer layer 202. The TFT may include an active layer 203, a gate electrode 205, a source electrode 207, and a drain electrode 208.

First, the active layer 203 having a predetermined pattern is formed on the buffer layer 202. The active layer 203 may be formed of an inorganic semiconductor, e.g., amorphous silicon or polysilicon, oxide semiconductor, or organic semiconductor, and may include a source region, a drain region, and a channel region. The source and drain regions of the active layer 203 may be formed of amorphous silicon or crystalline silicon doped with group-III or group-V impurities.

A gate insulating layer 204 may be formed on the active layer 203, and the gate electrode 205 may be formed on a predetermined region of the gate insulating layer 204. The gate insulating layer 204 may be formed of an organic material or an inorganic material, e.g., SiNx or $SiO_2$, for insulating the active layer 203 from the gate electrode 205.

The gate electrode 205 may include, e.g., Au, Ag, Cu, Ni, Pt, Pd, Al, or Mo, and an alloy, e.g., Al:Nd alloy or Mo:W alloy. However, example embodiments are not limited thereto. The gate electrode 205 may be formed to have a single-layered structure or a multi-layered structure.

An interlayer dielectric 206 may be formed on the gate electrode 205. The interlayer dielectric 206 and the gate insulating layer 204 may be formed to expose the source region and the drain region of the active layer 203, and the source electrode 207 and the drain electrode 208 may be formed to contact the exposed source and drain regions of the active layer 203, respectively. The source electrode 207 and the drain electrode 208 may be formed of various conductive materials, and may have single-layered or multi-layered structures.

A passivation layer 209 may be formed on the TFT. In more detail, the passivation layer 209 may be formed on the source and drain electrodes 207 and 208. The passivation layer 209 does not cover the entire portion of the drain electrode 208, and may be configured to expose a predetermined region. The first electrode 211 may be formed to connect to the exposed drain electrode 208 through the passivation layer 209.

The first electrode 211 may be formed, e.g., as an independent island type, in each of the pixels. A pixel defining layer 219 may be formed on the passivation layer 209 to cover edges of the first electrode 211. The intermediate layer 213 may be formed on the first electrode 211, and the intermediate layer 213 may include an organic emission layer to emit visible light. The second electrode 212 may be formed on the intermediate layer 213.

The non-emission area NA1 may be formed around the light emission area LA1, e.g., around the organic light emitting diode, to be adjacent to the light emission area LA1. The non-emission area NA1 may include the transmission area TA. The transmission area TA may be configured by forming a transmission window 212a in the second electrode 212, e.g., the transmission window 212a may expose an upper surface of the pixel defining layer 219.

Also, as another embodiment, the transmission area TA may be configured by forming the transmission window 212a in the second electrode 212 and a transmission window 219a in the pixel defining layer 219, as shown in FIG. 7. Here, the transmission window 212a in the second electrode 212 may have the same pattern as that of the transmission window 219a in the pixel defining layer 219.

Although not shown in the drawings, the example embodiments are not limited thereto. That is, the transmission window may be formed in one or more insulating layers (not shown) or in one or more conductive layers (not shown) formed on the substrate 201.

As shown in FIG. 8, each of the pixels P1, P2, and P3 includes the light emission area LA1, LA2, or LA3, respectively, and the pixels P1, P2, and P3 may include a common transmission area TA. However, example embodiments are not limited thereto, e.g., each of the pixels P1, P2, and P3 may include a separate transmission area TA, i.e., separate from each other like the light emission areas LA1, LA2, and LA3.

Referring back to FIG. 6, a reflective member 270 is formed on a surface of the encapsulation member 291. In detail, the reflective layer 270 is formed on a surface of the encapsulation unit 291, which faces the substrate 201. The reflective layer 270 includes one or more openings 270a1, and a reflective surface 271. The reflective surface 271 is disposed around the openings 270a1. Also, the reflective surface 271 is formed to correspond to the non-emission areas NA1, NA2, and NA3, and the openings 270a1 are formed to correspond to the light emission areas LA1, LA2, and LA3.

In more detail, referring to FIG. 8, the opening 270a1 of the reflective member 270 corresponds to the light emission area LA1 of the pixel P1, an opening 270a2 of the reflective member 270 corresponds to the light emission area LA2 of the pixel P2, and an opening 270a3 of the reflective member 270 corresponds to the light emission area LA3 of the pixel P3. The reflective surface 271 of the reflective member 270 is respectively formed on the non-emission areas NA1, NA2, and NA3 of the pixels P1, P2, and P3 around the openings 270a1, 270a2, and 270a3. Thus, the reflective surface 271 overlaps the transmission areas TA of the non-emission areas NA1, NA2, and NA3.

The reflective surface 271 has an appropriate, i.e., a predetermined, reflectivity. In particular, the reflective surface 271 has a reflectivity that is the same as or similar to the reflectivity of the pixels P1, P2, and P3, i.e., the reflectivity of the light emission areas LA1, LA2, and LA3. Since the reflectivity of the light emission areas LA1, LA2, and LA3 is nearly 60%, the reflectivity of the reflective surface 271 is about 60%. Thus, a difference between the reflectivity of the reflective surface 271 and an average reflectivity of the light emission areas LA1, LA2, and LA3 may be about 10% or less.

As such, the organic light emitting display apparatus 200 of the present embodiment may serve as an image display apparatus and as a mirror at the same time. Here, the reflectivity of the reflective surface 271 is similar to or the same as that of the light emission areas LA1, LA2, and LA3 displaying images, e.g., is set to be about 90% to about 110% of the average reflectivity of the light emission areas LA1, LA2, and LA3. Therefore, a mirror function may be realized effectively without affecting the images displayed on the light emission areas LA1, LA2, and LA3.

In detail, the reflective surface 271 may be formed of a predetermined metal material, e.g., Ni, Cr, W, V, or Mo. Such materials may have a reflectivity that is similar to that of the pixels P1, P2, and P3. In particular, the reflectivity of the pixels P1, P2, and P3 with respect to light of long wavelength (700 to 800 nm) is higher than the reflectivity of the pixels P1, P2, and P3 with respect to light of short wavelength (400 to 500 nm). Thus, the reflectivity of the reflective surface 271 with respect to the light of long wavelength (700 to 800 nm) is set to be higher than that with respect to the light of short wavelength (400 to 500 nm).

Also, the reflective surface 271 has an appropriate, i.e., a predetermined, thickness. In particular, the reflective surface 271 may have a thickness of about 500 μm or greater. If the thickness of a reflective surface is less than 500 μm, partial light may transmit through the reflective surface, thereby reducing the reflectivity of the reflective surface. When light transmits through a reflective surface and reduces reflectivity, a mirror display function of the organic light emitting display apparatus may not be shown effectively.

Therefore, according to example embodiments, the organic light emitting display apparatus 200 of the present embodiment includes the reflective member 270 on a lower surface of the encapsulation member 291 and with a thickness of about 500 μm or greater. The reflective member 270 includes the openings 270a1, 270a2, and 270a3 respectively corresponding to the light emission areas LA1, LA2, and LA3 of the pixels P1, P2, and P3, so as not to affect the image display of the light emission areas LA1, LA2, and LA3. Further, the reflective member 270 includes the reflective surface 271 corresponding to the non-emission areas NA1, NA2, and NA3, so that the organic light emitting display apparatus 200 may function as a mirror display. Here, the reflectivity of the reflective surface 271 is set to be similar to that of the light emission areas LA1, LA2, and LA3, and in particular, the reflectivity with respect to the longer wavelength (700 to 800 nm) is set to be higher than that with respect to the shorter wavelength (400 to 500 nm) so that the reflection tendency is similar to that of the light emission areas LA1, LA2, and LA3. As such, the organic light emitting display apparatus 200 having uniform and specular reflection characteristic may be provided without degrading image quality characteristics.

Also, the pixel circuit unit PC including the TFT is disposed in the light emission area LA. Thus, in a case of a top emission type, i.e., when an image emitted from the light emission area LA is displayed toward the encapsulation member 290, the light emission area may be increased and an aperture ratio is increased, thereby improving the image quality.

Selectively, each of the pixels P1, P2, and P3 includes the transmission area TA in the non-emission area NA, and the reflective surface 271 corresponds to the transmission area TA. Then, the light reflected by the reflective surface 271 may be emitted effectively toward the user through the transmission area TA. Thus, when the image emitted from the light emission area LA of the organic light emitting display apparatus 200 is displayed toward the encapsulation member 290, the light reflected by the reflective surface 271 is emitted toward the substrate 201 through the transmission area TA. Thus, at the substrate side 201, a general mirror function may be provided.

Figure 9:
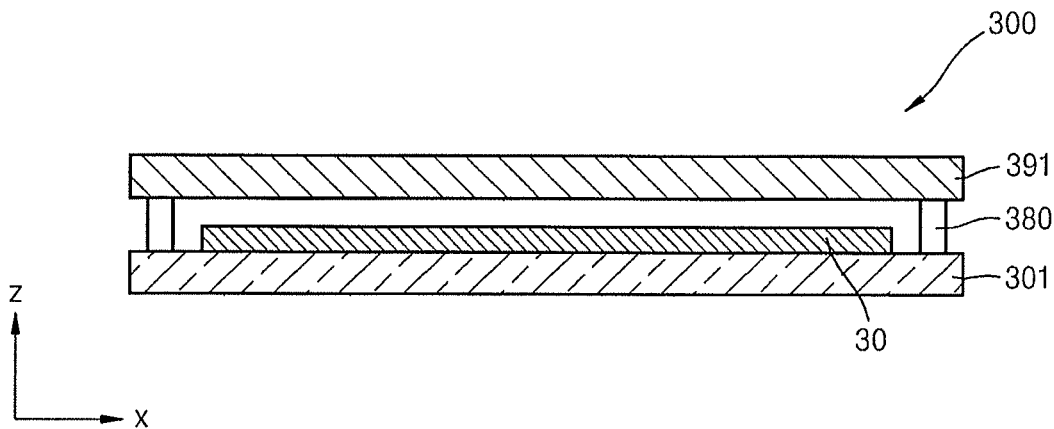
FIG. 9 is a schematic cross-sectional view of an organic light emitting display apparatus according to another embodiment.
Figure 10:
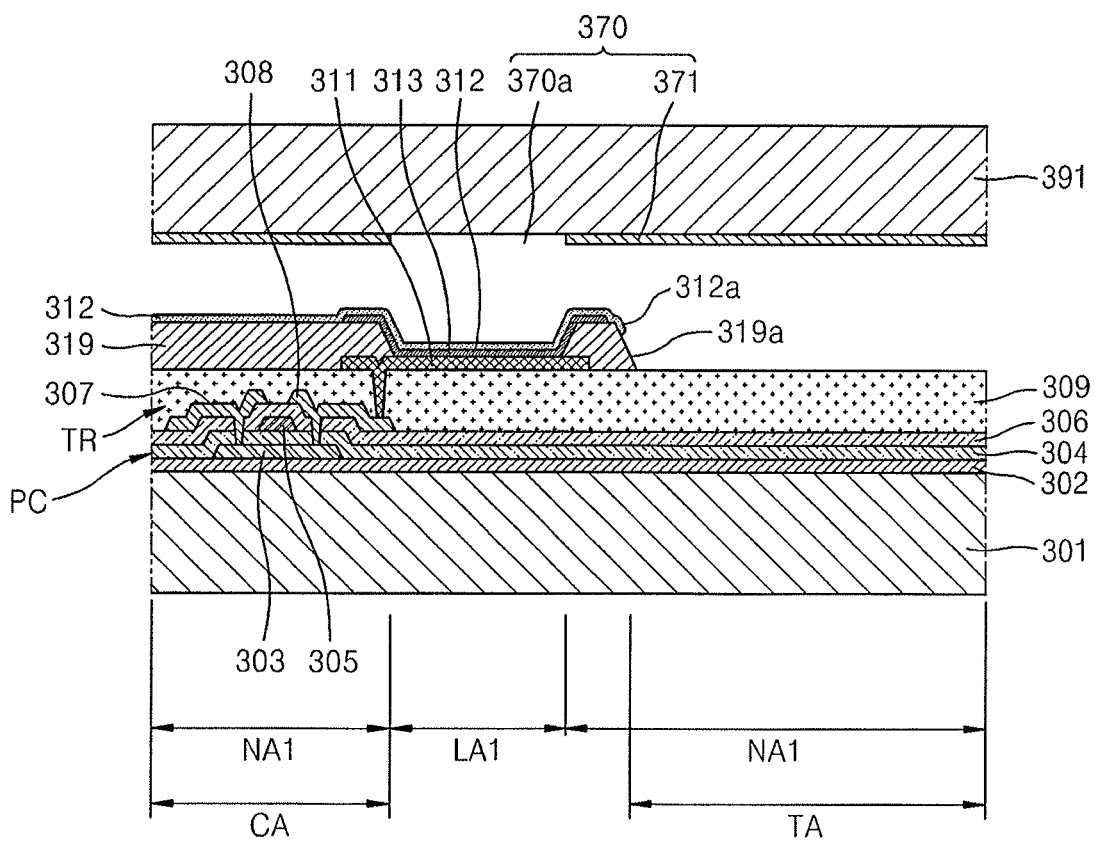
FIG. 10 is a cross-sectional view of a pixel in the organic light emitting display apparatus of FIG. 9.
Figure 11:
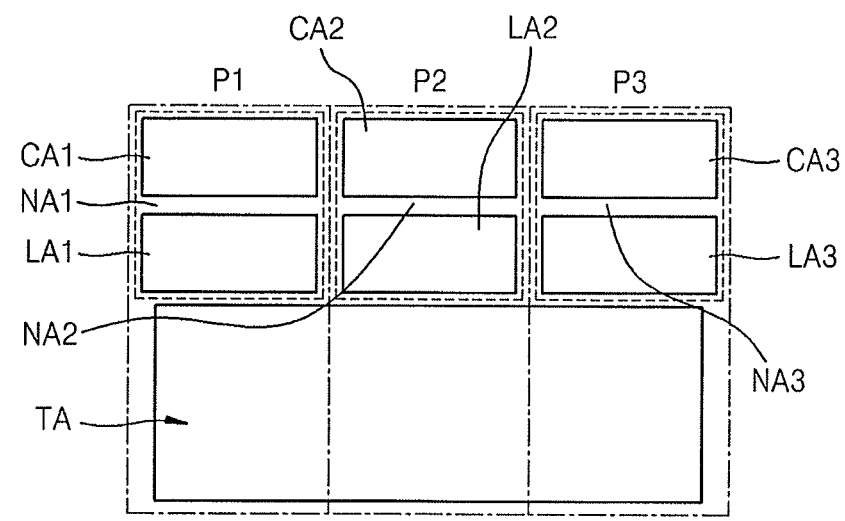
FIG. 11 is a detailed plan view of a reflective member from FIG. 10.
Figure 11:
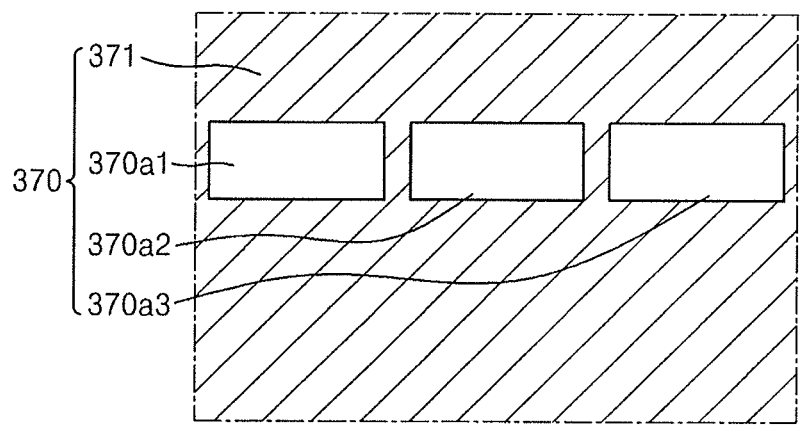

FIG. 9 is a schematic cross-sectional view of an organic light emitting display apparatus 300 according to another embodiment, FIG. 10 is a cross-sectional view showing a pixel in the organic light emitting display apparatus 300, and FIG. 11 is a plan view showing a reflective member in FIG. 10. For convenience of description, differences relative to the previous embodiments will be described below.

Referring to FIGS. 9 through 11, the organic light emitting display apparatus 300 may include a substrate 301, an encapsulation member 391, and a display unit 30 disposed between the substrate 301 and the encapsulation member 391. The substrate 301 and the encapsulation member 391 are bonded to each other by a sealing member 380.

The display unit 30 on the substrate 301 includes a plurality of pixels. FIG. 10 shows one pixel P1. FIG. 11 shows three pixels P1, P2, and P3.

Referring to FIG. 10, the pixel P1 includes a light emission area LA1 and a non-emission area NA1. The light emission area LA1 emits visible rays directly to display images recognized by the user. In the light emission area LA1, a first electrode 311, a second electrode 312, and an intermediate layer 313 are formed. In the non-emission area NA1, a circuit area CA1 and a transmission area TA are formed. The circuit area CA1 is disposed adjacent to the light emission area LA1, and as shown in FIG. 10, a pixel circuit unit PC may be disposed in the circuit area CA1.

The pixel circuit unit PC may include one or more TFT (TR). Although not shown in FIG. 10, data lines (not shown), scan lines (not shown), and power lines (not shown) may be connected to the pixel circuit unit PC, like in the previous embodiment.

Referring to FIG. 10, a buffer layer 302 may be formed on the substrate 301. As described above, since the buffer layer 302 is option, it may be omitted.

A TFT TR may be formed on the buffer layer 302. The TFT TR may include an active layer 303, a gate electrode 305, a source electrode 307, and a drain electrode 308.

First, the active layer 303 having a predetermined pattern is formed on the buffer layer 302. A gate insulating layer 304 is formed on the active layer 303, and the gate electrode 305 is formed on a predetermined region on the gate insulating layer 304.

An interlayer dielectric 306 is formed on the gate electrode 305. The interlayer dielectric 306 and the gate insulating layer 304 are formed to expose the source region and the drain region of the active layer 303, and the source electrode 307 and the drain electrode 308 are formed to contact the exposed source and drain regions of the active layer 303, respectively.

A passivation layer 309 is formed on the TFT TR. In more detail, the passivation layer 309 is formed on the source and drain electrodes 307 and 308. The passivation layer 309 does not cover the entire portion of the drain electrode 308, and is configured to expose a predetermined region. The first electrode 311 is formed to connect to the exposed drain electrode 308.

The first electrode 311 may be formed as an independent island type in each of the pixels. A pixel defining layer 319 is formed on the passivation layer 309 to cover edges of the first electrode 311.

The intermediate layer 313 is formed on the first electrode 311, and the intermediate layer 313 includes an organic emission layer to emit visible light. The second electrode 312 is formed on the intermediate layer 313.

As described above, the non-emission area NA1 is formed adjacent to the light emission area LA1 and the non-emission area NA1 may include the circuit area CA1 and the transmission area TA.

The transmission area TA may be formed by forming a transmission window 312a in the second electrode 312 and a transmission window 319a in the pixel defining layer 319. Here, the transmission window 312a formed in the second electrode 312 may have a pattern that is the same as the transmission window 319a formed in the pixel defining layer 319.

Although not shown in FIG. 10, the example embodiments are not limited thereto. For example, the transmission window may be formed in only one of the second electrode 312 and the pixel defining layer 319. Also, the transmission window may be formed in one or more insulating layers (not shown) or in one or more conductive layers (not shown) formed on the substrate 301.

Meanwhile, as shown in FIG. 11, the pixels P1, P2, and P3 respectively include the light emission areas LA1, LA2, and LA3, and the circuit areas CA1, CA2, and CA3.

The pixels P1, P2, and P3 may include a common transmission area TA. However, the example embodiments are not limited thereto, e.g., the pixels P1, P2, and P3 may include separate transmission areas like the light emission areas LA1, LA2, and LA3.

A reflective member 370 is formed on a surface of the encapsulation member 391. In particular, the reflective member 370 is formed on the surface of the encapsulation member 391, which faces the substrate 301. The reflective member 370 includes one or more openings 370a1, 370a2, and 370a3, and a reflective surface 371. The reflective surface 371 is disposed around the openings 370a1, 370a2, and 370a3. Also, the reflective surface 371 is formed to correspond to the non-emission area NA, and the openings 370a1, 370a2, and 370a3 are formed to correspond to the light emission areas LA1, LA2, and LA3.

In particular, referring to FIG. 11, the opening 370a1 of the reflective member 370 corresponds to the light emission area LA1 of the pixel P1, the opening 370a2 corresponds to the light emission area LA2 of the pixel P2, and the opening 370a3 corresponds to the light emission area LA3 of the pixel P3. The reflective surface 371 of the reflective member 370 is formed on the non-emission areas NA1, NA2, and NA3 of the pixels P1, P2, and P2, around the openings 370a1, 370a2, and 370a3. Therefore, the reflective surface 371 also overlaps the circuit areas CA1, CA2, and CA3 and the transmission area TA of the non-emission areas NA1, NA2, and NA3.

The reflective surface 371 has an appropriate reflectivity. In particular, the reflective surface 371 has the reflectivity that is the same as or similar to that of the pixels P1, P2, and P3, and in particular, the reflectivity of the light emission areas LA1, LA2, and LA3. Since the reflectivity of the light emission areas LA1, LA2, and LA3 is nearly 60%, the reflectivity of the reflective surface 371 is about 60%.

Roughly a difference between the reflectivity of the reflective surface 371a and an average reflectivity of the light emission areas LA1, LA2, and LA3 may be about 10% or less. As such, the organic light emitting display apparatus 300 of the present embodiment may provide both an image display function and a mirror function, at the same time. In other words, the organic light emitting display apparatus 300 of the present embodiment may provide an image display function through the light emission areas, i.e., where the organic light emitting diode emits light, and a mirror function through the non-transmission areas, i.e., through areas surrounding the transmission areas. Here, the reflectivity of the reflective surface 371 is the same as or similar to that of the light emission areas LA1, LA2, and LA3, i.e., the reflectivity of the reflective surface 371 is set as about 90% to about 110% of the average reflectivity of the light emission areas LA1, LA2, and LA3, so that the mirror function may be served effectively without affecting the image quality of the images emitted from the light emission areas LA1, LA2, and LA3.

The reflective surface 371 is formed by using a predetermined metal material, e.g., Ni, Cr, W, V, or Mo. Such metal materials have reflectivity that is similar to that of the pixels P1, P2, and P3. In particular, the reflectivity of the pixels P1, P2, and P3 with respect to light of long wavelength (700 to 800 nm) is higher than the reflectivity of the pixels P1, P2, and P3 with respect to light of short wavelength (400 to 500 nm). Thus, the reflectivity of the reflective surface 371 with respect to the light of long wavelength (700 to 800 nm) is set to be higher than that with respect to the light of short wavelength (400 to 500 nm). As such, the reflection property of the reflective surface 371 may be similar to that of the light emission area LA.

Also, the reflective surface 371 has an appropriate thickness. In particular, the reflective surface 371 may have a thickness of 500 μm or greater. If the thickness of the reflective surface 371 is less than 500 μm, partial light transmits through the reflective surface 371, thereby reducing the reflectivity of the reflective surface 371 less than a desired level. Thus, it is difficult to show the mirror display function of the organic light emitting display apparatus 300 effectively.

The organic light emitting display apparatus 300 of the present embodiment includes the reflective member 370 formed on a lower surface of the encapsulation member 391. The reflective member 370 includes openings 370a1 corresponding to the light emission areas LA of the pixels P1, P2, and P3 so as not to affect the display of images, and includes the reflective surface 371 corresponding to the non-emission areas NA1, NA2, and NA3 of the pixels P1, P2, and P3 so that the organic light emission display apparatus 300 may serve as a mirror display. Here, the reflectivity of the reflective surface 371 is set to be similar to that of the light emission areas LA1, LA2, and LA3, and in particular, the reflectivity with respect to the light of longer wavelength (700 to 800 nm) is set to be higher than that with respect to the light of shorter wavelength (400 to 500 nm) so that the reflection type of the reflective surface 371 is similar to that of the light emission areas LA1, LA2, and LA3. Thus, the organic light emitting display apparatus 300 that is uniform and shows the specular reflection property may be provided without degrading the image quality characteristics.

Also, the pixel circuit unit PC including the TFT TR is disposed on the circuit area CA of the non-emission area NA that does not overlap the light emission area LA. Thus, in a case of a bottom emission type in which the images emitted from the light emission area LA are displayed toward the substrate 301, the light emitted from the light emission area LA may proceed without interruption of the pixel circuit unit PC, thereby improving image quality.

Alternately, the pixels P1, P2, and P3 include the transmission area TA in the non-emission areas NA and the reflective surface 371 corresponds to the transmission area TA. Thus, the light reflected by the reflective surface 371 may be discharged to the user effectively through the transmission area TA. As such, in a case where the image emitted from the light emission area LA of the organic light emitting display apparatus 300 is displayed toward the substrate 301, the light reflected by the reflective surface 371 is discharged easily through the transmission area TA to the user, thereby improving the mirror display performance of the organic light emitting display apparatus 300.

As described above, according to the organic light emitting display apparatus of the example embodiments, user convenience may be improved easily. In contrast, when the first electrode, the second electrode, and other metal layers in the conventional organic light emitting display apparatus reflect external light, which reduces display characteristics, e.g., visibility of a user, an image quality of the organic light emitting display apparatus may decrease. Also, reflective characteristics of the first electrode, the second electrode, and metal layers in the light emission area may be very different from reflective characteristics in portions peripheral to the light emission area, so there is a limitation in increasing image quality and convenience of a user of the organic light emitting display apparatus.

While the example embodiments has been particularly shown and described with reference to exemplary embodiments thereof, it will be understood by those of ordinary skill in the art that various changes in form and details may be made therein without departing from the spirit and scope of the example embodiments as defined by the following claims.

What is claimed is:

1. An organic light emitting display apparatus, comprising:
    a substrate;
    an encapsulation member facing the substrate;
    a plurality of pixels between the substrate and the encapsulation member, each pixel including a light emission area and a non-emission area;
    a first electrode overlapping at least the light emission area;
    a pixel defining layer covering at least an edge of the first electrode, the pixel defining layer including a top surface, an open region, and an inclined surface that inclines between the open region and the top surface;
    an intermediate layer on the first electrode corresponding to the open region the intermediate layer including an organic emission layer;
    a second electrode on the intermediate layer; and
    a reflective member including an opening and a reflective surface around the opening, wherein
    the inclined surface of the pixel defining layer surrounds the open region and is connected to the top surface of the pixel defining layer, and
    a boundary between the opening and the reflective surface of the reflective member overlaps the inclined surface of the pixel defining layer in a plan view.

2. The organic light emitting display apparatus of claim 1, further comprising a transmission area on the non-emission area, the transmission area overlapping the reflective surface of the reflective member.

3. The organic light emitting display apparatus of claim 2, wherein the transmission area is common to at least two pixels among the plurality of pixels.

4. The organic light emitting display apparatus of claim 2, wherein the second electrode includes a transmission window corresponding to the transmission area.

5. The organic light emitting display apparatus of claim 2, wherein each of the pixels includes at least one insulating layer, the at least one insulating layer including a transmission window corresponding to the transmission area.

6. The organic light emitting display apparatus of claim 5, wherein the second electrode includes a transmission window corresponding to the transmission area, the transmission window of the insulating layer and the transmission window of the second electrode have same patterns.

7. The organic light emitting display apparatus of claim 1, wherein the reflective surface of the reflective member exhibits a specular reflection property.

8. The organic light emitting display apparatus of claim 1, wherein a reflectivity of the reflective member is about 90% to about 110% of an average reflectivity of the light emission area.

9. The organic light emitting display apparatus of claim 1, wherein the reflectivity of the reflective surface of the reflective member with respect to light having a wavelength of about 700 nm to 800 nm is greater than the reflectivity with respect to light having a wavelength of about 400 nm to 500 nm.

10. The organic light emitting display apparatus of claim 1, wherein the reflective member includes at least one of Ni, Cr, W, V, and Mo.

11. The organic light emitting display apparatus of claim 1, wherein each of the pixels includes a pixel circuit unit configured to drive the light emission area, the pixel circuit unit overlapping the light emission area.

12. The organic light emitting display apparatus of claim 1, wherein each of the pixels includes a circuit area on the non-emission area and a pixel circuit unit for driving the light emission area, the pixel circuit unit being on the circuit area.

13. The organic light emitting display apparatus of claim 1, wherein each of the pixels includes a pixel circuit unit for driving the light emission area, and the pixel circuit unit includes a thin film transistor electrically connected to the first electrode and includes an active layer, a gate electrode, a source electrode, and a drain electrode.

14. The organic light emitting display apparatus of claim 1, wherein the reflective member is disposed on a bottom surface of the encapsulation member, the bottom surface of the encapsulation member facing the substrate.

* * * * *